United States Patent [19]
Frisina et al.

[11] Patent Number: 5,939,769
[45] Date of Patent: *Aug. 17, 1999

[54] BIPOLAR POWER TRANSISTOR WITH HIGH COLLECTOR BREAKDOWN VOLTAGE AND RELATED MANUFACTURING PROCESS

[75] Inventors: Ferruccio Frisina, Sant'Agata Li Battiati; Salvatore Coffa, Tremestieri Etneo, both of Italy

[73] Assignee: Consorzio per la Ricerca sulla Microelettronica nel Mezzogiorno, Catania, Italy

[ * ] Notice: This patent issued on a continued prosecution application filed under 37 CFR 1.53(d), and is subject to the twenty year patent term provisions of 35 U.S.C. 154(a)(2).

[21] Appl. No.: 08/904,257

[22] Filed: Jul. 31, 1997

Related U.S. Application Data

[63] Continuation of application No. 08/579,472, Dec. 27, 1995, abandoned, which is a continuation of application No. 08/266,029, Jun. 27, 1994, abandoned.

[30] Foreign Application Priority Data

Jun. 28, 1993 [EP] European Pat. Off. ............. 93830276

[51] Int. Cl.$^6$ ...................... H01L 27/082; H01L 27/102; H01L 29/70; H01L 31/11
[52] U.S. Cl. ........................... 257/592; 257/607; 257/655
[58] Field of Search .................................. 257/592, 607, 257/655

[56] References Cited

U.S. PATENT DOCUMENTS

| | | |
|---|---|---|
| 4,074,293 | 2/1978 | Kravitz . |
| 4,559,696 | 12/1985 | Anand et al. ............................ 257/591 |
| 4,667,393 | 5/1987 | Ferla et al. .............................. 257/592 |
| 4,805,004 | 2/1989 | Gandolfi et al. ........................ 257/592 |
| 4,975,381 | 12/1990 | Taka et al. ............................... 437/31 |
| 5,475,245 | 12/1995 | Kudo et al. ............................. 257/288 |

FOREIGN PATENT DOCUMENTS

| | | | |
|---|---|---|---|
| A-0439753 | 8/1991 | European Pat. Off. ......... | H01L 29/73 |
| A-2282721 | 3/1976 | France ........................... | H01L 27/06 |
| A-2163597 | 2/1986 | United Kingdom ............ | H01L 29/06 |

OTHER PUBLICATIONS

Solid State Technology, vol. 19, Mar. 1976, Washington, U.S., pp. 29–32, A.H. Berman, "Glass Passivation Improves High Voltage Transistors".

*Primary Examiner*—Ngân V. Ngô
*Attorney, Agent, or Firm*—Wolf, Greenfield & Sacks, P.C.

[57] ABSTRACT

There is described a bipolar power transistor with high breakdown voltage, obtained in a heavily doped semiconductor substrate of the N type, over which a lightly doped N type layer, constituting a collector region of the transistor, is superimposed. The transistor has a base region comprising a heavily doped P type diffusion, which extends into the lightly doped N type layer from a top surface. The transistor further includes an emitter region constituted by a heavily doped N type diffusion extending from the top surface within said heavily doped P type diffusion. The heavily doped P type diffusion is obtained within a deep lightly doped P type diffusion, extending from said top surface into the lightly doped N type layer and formed with acceptor impurities of aluminum atoms.

33 Claims, 2 Drawing Sheets

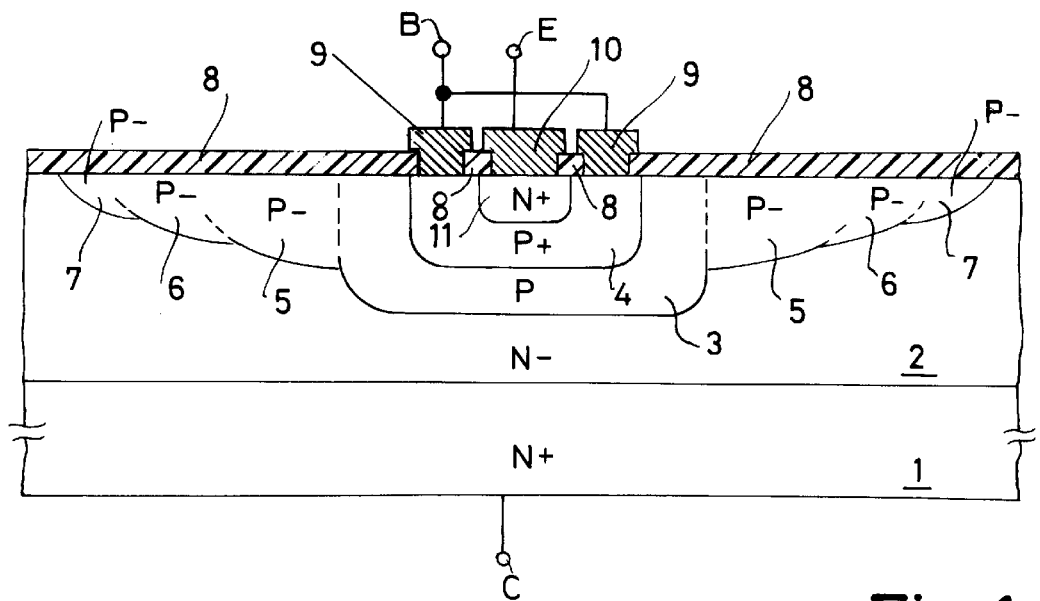
Fig.1
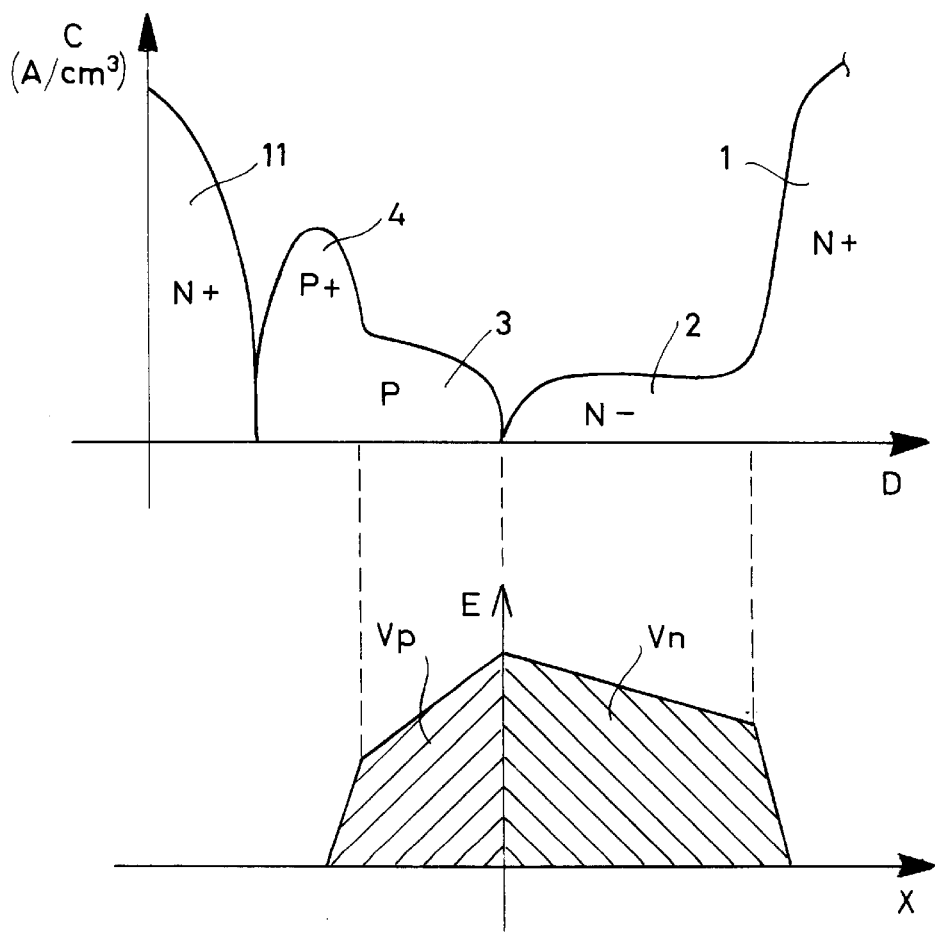
Fig.2
Fig.3

BIPOLAR POWER TRANSISTOR WITH HIGH COLLECTOR BREAKDOWN VOLTAGE AND RELATED MANUFACTURING PROCESS

This application is a continuation of application Ser. No. 08/579,472, filed Dec. 27, 1995, abandoned, which is a continuation of application Ser. No. 08/266,029, filed Jun. 27, 1994, abandoned.

BACKGROUND OF THE INVENTION

1. Field of the Invention

The present invention relates to a bipolar power transistor with high collector breakdown voltage and a corresponding manufacturing process.

2. Discussion of the Related Art

In bipolar power transistors fabricated by planar technology the collector region sustains almost the entire reverse voltage applied to the base-collector junction. This is a consequence of the electric field distribution across the junction, which depends on the doping concentration profile of the transistor's base region.

Because of this limitation, prior art, high voltage bipolar transistors do not use a planar structure. Rather they use a so-called "mesa" structure in which each transistor resembles a little mesa whose vertical walls terminate the base-collector junction.

One of the basic technologies by which mesa transistors are fabricated is known as MultiEpitaxial Mesa ("MEM"). In the MEM technology, the base region comprises a lightly doped P– epitaxial layer, grown over an N– epitaxial layer (from which comes the name of the technology). A P+ region is then diffused therein, see e.g., (article title), *Solid State Technology*, March 1976 at 29–32. The corresponding base doping concentration profile causes a significant percentage of the total reverse voltage applied to the base-collector junction to be sustained by the P– epitaxial portion of the base region, i.e., not the N– epitaxial collector only. The electric field distribution in both the base and the collector regions determines some of the electrical characteristics of the transistor, such as the gain dependence on the collector current and the ruggedness in secondary breakdown and in direct breakdown.

Even though this technology allows the fabrication of transistors with collector breakdown voltages up to 2000 V, it involves the passivation of the base-collector junction with glass. The glass is deposited in an annular moat, obtained by etching the silicon down to the N– epitaxial layer, a complex and expensive process. The moat, circumscribing each transistor to isolate its base from the other transistors' bases, gives rise to the mesa structure of the transistor. Mesa transistors exhibit low reliability with respect to transistors obtained by planar technologies, in which the base-collector junction is passivated by means of thermal oxide.

In view of the state of the art described, an object of the present invention is to provide a bipolar power transistor obtained with a planar manufacturing process and which has a high base-collector breakdown voltage and has an electric field distribution in the base region Like that of mesa technology.

SUMMARY OF THE INVENTION

According to the present invention, such object is achieved by means of a bipolar power transistor with a high breakdown voltage. The transistor comprises a heavily doped semiconductor substrate of the N type, over which a lightly doped N type layer, constituting a collector region of the transistor, is superimposed. A base region of the transistor comprises a heavily doped P type diffusion, which extends into the lightly doped N type layer from a top surface. An emitter region of the transistor includes a heavily doped N type diffusion extending from the top surface within the heavily doped P type diffusion. The heavily doped P type diffusion is obtained within a deep, lightly doped P type diffusion, extending from said top surface into the lightly doped N type layer and formed with acceptor impurities of aluminum atoms, for example.

In a preferred embodiment of the invention, a plurality of merged concentric rings are provided around the deep lightly doped P type diffusion. Each ring is constituted by an annular P type region extending from the top surface into the lightly doped N type layer. In addition, each ring is formed with acceptor impurities of aluminum atoms and has a dopant concentration that is lower than that of the adjacent internal ring and higher than that of the adjacent external ring.

According to the invention, there is also provided a process for manufacturing the described bipolar power transistor. The process comprises the following steps:

a) growing a lightly doped N type epitaxial layer over a heavily doped semiconductor substrate of the N type;

b) growing oxide over a top surface of said epitaxial layer;

c) masked implanting of aluminum atoms into said epitaxial layer;

d) drive-in diffusing the aluminum atoms into the epitaxial layer to form a deep lightly doped P type base region;

e) masked implanting of a high concentration of acceptor dopants into said deep lightly doped P type base region;

f) drive-in diffusing the acceptor dopants into the deep lightly doped P type base region to obtain a heavily doped P type base region within the deep, lightly doped P type base region;

g) masked implanting of a high concentration of donor dopants into said heavily doped P type base region; and h) drive-in diffusing the donor dopants into the heavily doped P type base region to obtain a diffused heavily doped emitter region.

According to the present invention, it is possible to produce bipolar power transistors with planar structure, which have a base doping profile similar to that of mesa transistors obtained in MEM technology and which show high breakdown voltages.

BRIEF DESCRIPTION OF THE DRAWINGS

The features of the present invention shall be made more evident by the following detailed description of its preferred embodiment, illustrated as a non-limiting example in the annexed drawings, wherein:

FIG. 1 a cross-sectional view of a bipolar power transistor according to the preferred embodiment of the invention;

FIG. 2 is a doping concentration profile diagram (Concentration versus Depth) of said bipolar power transistor;

FIG. 3 is a diagram (Electric field versus Distance from the base-collector junction) showing the electric field distribution across a reverse-biased base-collector junction.

DETAILED DESCRIPTION

Figure 4:
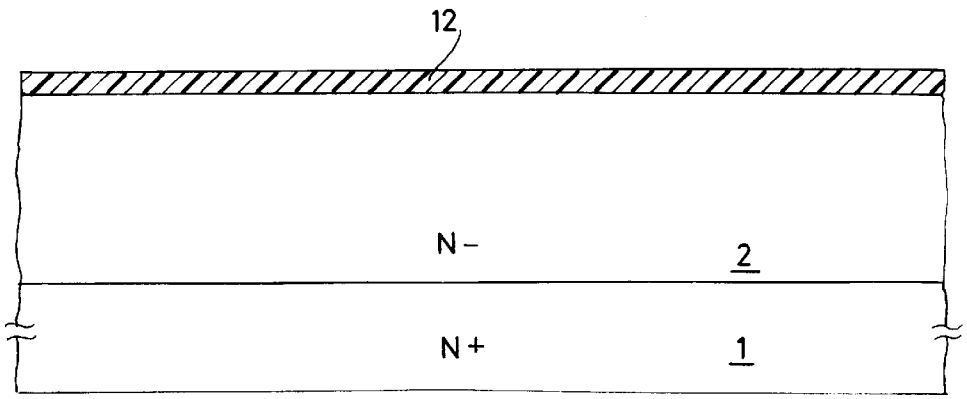
FIGS. 4 to 7 are cross-sectional views of the bipolar power transistor taken at intermediate steps of the manufacturing process according to the invention.

With reference to FIG. 1, a bipolar power transistor according to the invention is formed in a semiconductor substrate 1 of the N+ type, generally with (111) crystal orientation. Over the substrate 1 there is superimposed a lightly doped N-type epitaxial layer 2, having dopant concentration ranging from $10^{13}$ to $10^{14}$ atoms per $cm^3$ and a thickness of 100–150 μm. The epitaxial layer 2, together with the semiconductor substrate 1, forms a collector region of the bipolar power transistor.

A deep, aluminum-doped P type region 3 extends from a top surface into the epitaxial layer 2 to a depth of approximately 30–40 μm. In addition, a heavily doped P+ type region 4, doped for example with boron, extends from the top surface within the deep P type regions 3 to a depth of about 10 μm. The P+ type region 4, together with the P type deep region 3, forms a base region of the bipolar power transistor.

A heavily doped N+ type region 11 extends from the top surface within the P+ type region 4 and forms an emitter region of the bipolar power transistor.

Three concentrical rings 5, 6, and 7, constituted by lightly doped P type aluminum-doped regions, extend from the top surface into the epitaxial layer 2 and around the deep P type region 3. The dopant concentration of the ring 5 is higher than that of the ring 6, which, in turn, has a dopant concentration higher than that of the ring 7.

An insulating oxide layer 8 is superimposed over the top surface, and contact areas are provided to allow strips 9 and 10 of a conductive layer to contact the P+ type region 4 and the N+ type region 11, respectively. The strip 9 is connected to a base terminal B, and the strip 10 is connected to an emitter terminal E. The substrate 1 is also connected to a collector terminal C.

Because aluminum in silicon behaves as an acceptor dopant and has a high diffusivity (approximately ten times higher than the diffusivity of boron), it is possible to obtain a deep base-collector junction having the dopant concentration profile shown in FIG. 2. The base region has a high dopant concentration near the emitter-base junction (region 4), suitable to achieve low base resistance. Near the base-collector junction (region 3), however, the base dopant concentration is much lower and comparable with that of the epitaxial layer 2. This allows the base region to sustain a significant part of the total reverse voltage applied to the base-collector junction and, consequently, leads to a higher breakdown voltage, since the peak value of the electric field at the metallurgical junction diminishes. This is shown in FIG. 3, in which Vp and Vn are the fractions of the total reverse voltage applied to the base-collector junction sustained by the base and collector regions respectively. These voltages are given by the areas subtended by the electric field distribution in the two regions.

Unlike other high-diffusivity species, aluminum does not introduce deep states responsible for an increase in leakage currents and, consequently, a decrease in the transistor's current gain.

Lightly doped rings 5, 6, and 7 lead to a further increase in the base-collector breakdown voltage, because the rings reduce the edge effects on the electric field by smoothing the corners of the P type region 3.

Figure 5:
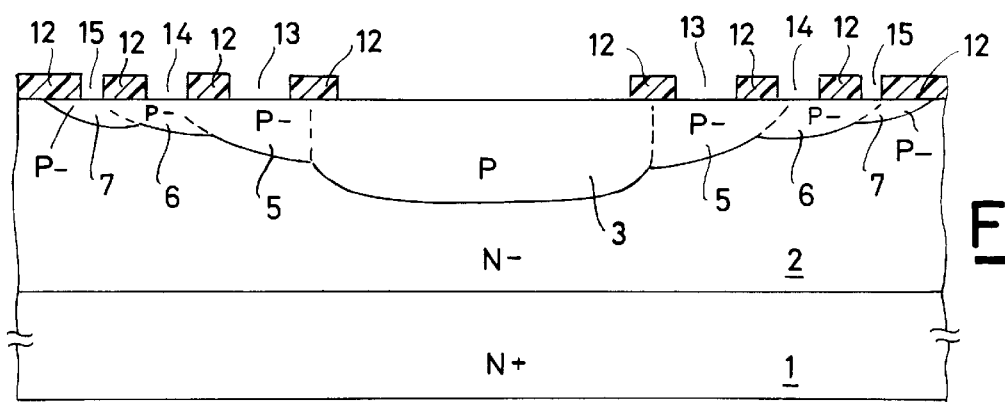

The manufacturing process according to the present invention starts with the growth of the N− epitaxial layer 2 over the N+ semiconductor substrate 1. After the oxidation of the entire top surface of the epitaxial layer 2 (FIG. 4), the oxide layer 12 thus formed is selectively etched, and aluminum atoms are implanted into selected areas of the epitaxial layer 2. With a subsequent drive-in diffusion step, the deep P type regions 3 and the rings 5, 6, and 7 are simultaneously formed (FIG. 5). The higher dopant concentration of ring 5 with respect to ring 6, and of ring 6 with respect to ring 7, is achieved by etching the oxide layer 12 to form annular windows 13, 14, and 15 with decreasing area, so as to decrease the aluminum total amount of implanted into silicon (FIG. 5).

From this point on, the process is similar to a traditional planar process.

Figure 6:
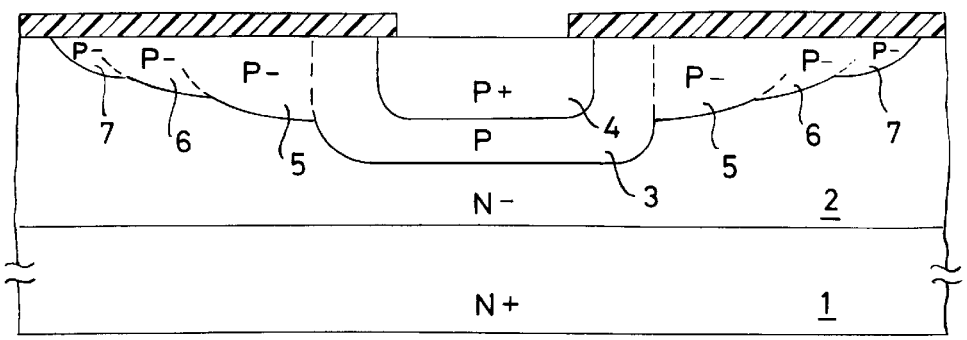

After the oxidation of the top surface, a high dose of boron is selectively implanted into the deep P type region 3. A subsequent drive-in diffusion allows the formation of the heavily doped P+ type region 4, and the simultaneous further diffusion of the aluminum atoms of region 3 makes it possible to achieve a base-collector junction depth of about 30–40 μm (FIG. 6).

Figure 7:
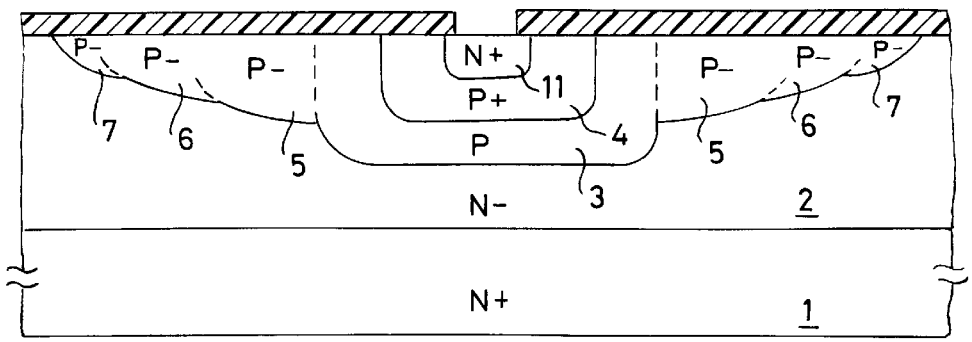

A further oxidation of the top surface is then performed, and donor impurities are selectively implanted into the P+ type region 4 to form, after a drive-in diffusion, the heavily doped N+ emitter region 11 (FIG. 7).

After the definition of contact areas (FIG. 1), a conductive layer is deposited over the entire surface and selectively removed to allow the formation of the strips 9 and 10. An electrical contact to the bottom surface of the substrate 1 is also provided.

The surface of the chip is finally passivated, for example by means of silicon nitride.

Having thus described one particular embodiment of the invention, various alterations, modifications, and improvements will readily occur to those skilled in the art. Such alterations, modifications, and improvements are intended to be part of this disclosure, and are intended to be within the spirit and scope of the invention. Accordingly, the foregoing description is by way of example only and is limited only as defined in the following claims and the equivalents thereto.

What is claimed is:

1. A bipolar power transistor having a high breakdown voltage, comprising:

a heavily doped semiconductor substrate of N type;

superimposed over said substrate, a lightly doped N type layer collector region;

a base region comprising a deep lightly doped P type diffusion, having a dopant concentration profile gradient, extending from a top surface of said substrate into said lightly doped N type layer and including acceptor impurities of aluminum atoms, said base region further comprising a heavily doped P type diffusion extending into said deep lightly doped P type diffusion from said top surface of said substrate;

an emitter region of a heavily doped N type diffusion extending from said top surface within said heavily doped P type diffusion;

wherein the deep lightly doped P type diffusion of the base region defines a P-N junction between the base region and the lightly doped N type layer collector region, wherein at the P-N junction the doping concentration of the deep lightly doped P type diffusion region is substantially comparable with the doping concentration of said lightly doped N type layer collector region, the P-N junction being defined by an extent of penetration of aluminum ions diffused into the lightly doped N type layer to form the deep lightly doped P type diffusion.

2. The bipolar power transistor according to claim 1, wherein around said deep lightly doped P type diffusion there are provided a plurality of merged concentric rings, each ring comprising an annular P type region extending from said top surface into said lightly doped N type layer and formed with acceptor impurities of aluminum atoms, each ring having a dopant concentration which is lower than that of an adjacent internal ring and higher than that of an adjacent external ring.

3. The bipolar power transistor according to claim 1, wherein said lightly doped N type layer is an epitaxial layer.

4. The bipolar power transistor according to claim 1, wherein said heavily doped P type diffusion includes acceptor impurities of boron atoms.

5. A bipolar power transistor, comprising:

a substrate with a collector region therein;

a base region having a first portion and a second portion, the first portion being a lightly doped diffusion extending from a top surface deep into the collector region having a dopant concentration profile gradient, the second portion being a heavily doped diffusion extending from the top surface into the first portion; and an emitter region extending from the top surface into the second portion;

wherein the lightly doped diffusion of the base region defines a P-N junction between the base region and the collector region wherein at the P-N junction the doping concentration of the lightly doped diffusion is substantially comparable with the doping concentration of said collector region, the P-N junction being defined by an extent of penetration of impurities diffused into the collector region to form the lightly doped diffusion.

6. The bipolar power transistor of claim 5, further comprising a plurality of merged concentric rings disposed around the first portion, each ring being of a similar diffusion type as the first portion but having dopant concentrations that get progressively lower as the rings extend away from the first portion.

7. The bipolar power transistor of claim 5, wherein said second portion includes acceptor impurities having a high diffusivity characteristic in relation to the substrate and which does not introduce deep states into the substrate.

8. The bipolar power transistor of claim 7 wherein the acceptor impurities are aluminum atoms.

9. The bipolar power transistor of claim 6, wherein said second portion includes acceptor impurities having a high diffusive characteristic in relation to the substrate.

10. The bipolar power transistor of claim 9, wherein the acceptor impurities are aluminum atoms.

11. A bipolar power transistor comprising:

a collector region of a first conductivity type formed in a substrate;

a base region of a second conductivity type that is different from the first conductivity type, the base region having a first portion and a second portion, the first portion being a lightly doped diffusion extending from a top surface deep into the collector region, the second portion being a heavily doped diffusion extending from the top surface into the first portion, the base region including a center area and at least one concentric ring, the at least one concentric ring being disposed around the center area and having an edge that defines a portion of a P-N junction that is between the base region and the collector region; and an emitter region, coupled to the base region.

12. The bipolar power transistor of claim 11, wherein:

the center area of the base region has impurities of a first type; and the at least one concentric ring includes a plurality of merged concentric rings each having a concentration of impurities of the first type, the concentration of impurities of one of the plurality of merged concentric rings being less than the concentration of impurities of another of the plurality of merged concentric rings that the one of the plurality of merged concentric rings encircles.

13. The bipolar power transistor of claim 11, further including means for distributing an electric field across the base region.

14. The bipolar power transistor of claim 13, wherein the means for distributing includes acceptor impurities having a high diffusive characteristic in relation to the substrate.

15. The bipolar power transistor of claim 14, wherein the acceptor impurities are aluminum atoms.

16. A bipolar power transistor comprising:

a collector region formed in a substrate;

a base region including a first diffused portion having a first concentration of impurities having a dopant concentration profile gradient, and a second diffused portion having a second concentration of impurities that is greater than the first concentration of impurities, wherein the second diffused portion is adjacent the first diffused portion;

an emitter region coupled to the second diffused portion of the base region;

wherein the first diffused portion of the base region defines a P-N junction between the base region and the collector region, wherein at the P-N junction the doping concentration of the first diffused portion of the base region is substantially comparable with the doping concentration of said collector region, the P-N junction being defined by an extent of penetration of impurities into the collector region to form the first diffused portion.

17. The bipolar power transistor of claim 16, wherein the first concentration of impurities includes impurities of a first type, the bipolar power transistor further comprising a plurality of merged concentric rings, each of the plurality of merged concentric rings being disposed around the base region and having a concentration of impurities of the first type, the concentration of impurities of at least one of the plurality of merged concentric rings being less than the concentration of impurities of another of the plurality of merged concentric rings that the at least one of the plurality of merged concentric rings encircles.

18. The bipolar power transistor of claim 17, wherein the first concentration of impurities includes acceptor impurities having a high diffusive characteristic in relation to the substrate.

19. The bipolar power transistor of claim 18, wherein the acceptor impurities are aluminum atoms.

20. The bipolar power transistor of claim 19, wherein the first diffused portion of the base is lightly doped with impurities, and the second diffused portion of the base is heavily doped with impurities.

21. The bipolar power transistor of claim 16, wherein the first concentration of impurities includes acceptor impurities having a high diffusive characteristic in relation to the substrate.

22. The bipolar power transistor of claim 21, wherein the acceptor impurities are aluminum atoms.

23. The bipolar power transistor of claim 22, wherein the first diffused portion of the base is lightly doped with impurities, and the second diffused portion of the base is heavily doped with impurities.

24. The bipolar power transistor of claim 16, wherein the first diffused portion of the base is lightly doped with impurities, and the second diffused portion of the base is heavily doped with impurities.

25. A bipolar power transistor comprising:

a substrate having a top surface;

a collector region within the substrate;

a base region comprising a first diffusion portion extending from the top surface of the substrate into the collector region and including a first concentration of acceptor impurities of a first type having a dopant concentration profile gradient, the base region further comprising a second diffusion portion extending into the first diffusion portion from the top surface of the substrate, the second diffusion portion having a second concentration of acceptor impurities of the first type that is greater than the first concentration;

an emitter region extending from the top surface of the substrate into the second diffusion portion of the base region;

wherein the first diffusion portion of the base region defines a P-N junction between the base region and the collector region, wherein at the P-N junction the doping concentration of the first diffusion portion of the base region is substantially comparable with the doping concentration of said collector region, the P-N junction being defined by an extent of penetration of impurities diffused into the collector region to form the first diffusion portion.

26. The bipolar power transistor of claim 25, further comprising a plurality of merged concentric rings, each of the plurality of merged concentric rings being disposed around the base region and having a concentration of impurities of the first type, the concentration of impurities of at least one of the plurality of merged concentric rings being less than the concentration of impurities of another of the plurality of merged concentric rings that the at least one of the plurality of merged concentric rings encircles.

27. The bipolar power transistor of claim 26, wherein the first concentration of acceptor impurities has a high diffusive characteristic in relation to the substrate.

28. The bipolar power transistor of claim 27, wherein the acceptor impurities are aluminum atoms.

29. The bipolar power transistor of claim 28, wherein the first diffusion portion of the base is lightly doped with acceptor impurities of the first type, and the second diffusion portion of the base is heavily doped with acceptor impurities of the first type.

30. The bipolar power transistor of claim 25, wherein the first concentration of acceptor impurities has a high diffusive characteristic in relation to the substrate.

31. The bipolar power transistor of claim 30, wherein the acceptor impurities are aluminum atoms.

32. The bipolar power transistor of claim 22, wherein the first diffusion portion of the base is lightly doped with acceptor impurities of the first type, and the second diffusion portion of the base is heavily doped with acceptor impurities of the first type.

33. The bipolar power transistor of claim 25, wherein the first diffusion portion of the base is lightly doped with acceptor impurities of the first type, and the second diffusion portion of the base is heavily doped with acceptor impurities of the first type.

* * * * *